United States Patent
Song et al.

(10) Patent No.: US 8,415,688 B2
(45) Date of Patent: Apr. 9, 2013

(54) ORGANIC LIGHT EMITTING DIODE DISPLAY

(75) Inventors: Hyung-Jun Song, Yongin (KR); Chang-Ho Lee, Yongin (KR); Hee-Joo Ko, Yongin (KR); Jin-Young Yun, Yongin (KR); Se-Jin Cho, Yongin (KR); Il-Soo Oh, Yongin (KR); Jong-Hyuk Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 187 days.

(21) Appl. No.: 12/926,378

(22) Filed: Nov. 15, 2010

(65) Prior Publication Data

US 2011/0114974 A1    May 19, 2011

(30) Foreign Application Priority Data

Nov. 16, 2009 (KR) .................. 10-2009-0110477

(51) Int. Cl.
*H01L 29/20* (2006.01)

(52) U.S. Cl. ............ 257/89; 257/14; 257/40; 257/66; 257/79; 257/99

(58) Field of Classification Search .................. None
See application file for complete search history.

(56) References Cited

U.S. PATENT DOCUMENTS

| 6,160,828 | A | * | 12/2000 | Kozlov et al. ............... 372/39 |
| 6,639,250 | B1 | | 10/2003 | Shimoda et al. |
| 6,750,928 | B2 | | 6/2004 | Hiji et al. |
| 7,009,666 | B2 | | 3/2006 | Khan et al. |
| 7,038,757 | B2 | | 5/2006 | Park et al. |

FOREIGN PATENT DOCUMENTS

| GB | 2353400 A | 2/2001 |
| JP | 2001-357979 A | 12/2001 |
| JP | 2003-508876 A | 3/2003 |
| JP | 2005-347073 A | 12/2005 |
| JP | 2008-226718 | 9/2008 |
| JP | 2009-231257 A | 10/2009 |
| KR | 10 2001-00028 A | 1/2001 |
| KR | 10-0495971 B1 | 6/2005 |
| KR | 10 2008-00265 A | 3/2008 |

OTHER PUBLICATIONS

Jeong, et al., "Optical cavity with a double-layered cholesteric liquid crystal mirror and its application to solid state laser," Applied Physics Letters, 89:241116, (2006).

* cited by examiner

*Primary Examiner* — Kyoung Lee
(74) *Attorney, Agent, or Firm* — Lee & Morse, P.C.

(57) ABSTRACT

An organic light emitting diode display includes a first electrode and a second electrode, an organic emissive layer disposed between the first electrode and the second electrode, a first selective reflection layer disposed to receive light from the organic emissive layer, and a third transparent electrode, the first selective reflection layer being between the third transparent electrode and the organic emissive layer.

9 Claims, 9 Drawing Sheets

ORGANIC LIGHT EMITTING DIODE DISPLAY

BACKGROUND

1. Field

Embodiments relate to an organic light emitting diode display.

2. Description of the Related Art

An organic light emitting diode display has a self emissive characteristic, and differs from a liquid crystal display (LCD) in that it does not require a separate light source and has a relatively small thickness and weight. Furthermore, the organic light emitting diode display exhibits high quality characteristics such as low power consumption, high luminance, and short response time.

A transparent organic light emitting diode display may make it possible to recognize an object at a backside thereof. The transparent organic light emitting diode display may have a see-through region (with no organic light emitting diode) that transmits external light therethrough, which may be formed adjacent to an organic light emitting diode having a reflective layer. However, if the see-through region is widened to increase the transmittance, the organic light emitting diode may be reduced in size so that the light emission efficiency is lowered.

The above information disclosed in this Background section is only for enhancement of understanding of the background of the described technology and therefore it may contain information that does not form the prior art.

SUMMARY

Embodiments are directed to an organic light emitting diode display, which substantially overcomes one or more of the problems due to the limitations and disadvantages of the related art.

It is therefore a feature of an embodiment to provide a transparent organic light emitting diode display that exhibits increased light emission efficiency and improved the image quality.

At least one of the above and other features and advantages may be realized by providing an organic light emitting diode display, including a first electrode and a second electrode, an organic emissive layer disposed between the first electrode and the second electrode, a first selective reflection layer disposed to receive light from the organic emissive layer, and a third transparent electrode, the first selective reflection layer being between the third transparent electrode and the organic emissive layer.

The organic emissive layer may include a first sub-emission layer configured to emit a blue color light, a second sub-emission layer configured to emit a green color light, and a third sub-emission layer configured to emit a red color light, and the first selective emission layer may selectively reflect the blue color light emitted from the first sub-emission layer.

The first sub-emission layer may be spaced apart from the first selective reflection layer by a first length, the second sub-emission layer may be spaced apart from the first selective reflection layer by a second length that is greater than the first length, the third sub-emission layer may be spaced apart from the first selective emission layer by a third length that is greater than the second length, and the fourth, fifth, and sixth lengths may be predetermined so as to generate microcavity effects.

The organic light emitting diode display may further include a second selective reflection layer, the third transparent electrode being between the second selective reflection layer and the organic emissive layer, and a fourth transparent electrode, the second selective reflection layer being between the fourth transparent electrode and the organic emissive layer. The second selective reflection layer may selectively reflect the green color light emitted from the second sub-emission layer.

The organic light emitting diode display may further include a third selective reflection layer, the fourth transparent electrode being between the third selective reflection layer and the organic emissive layer, and a fifth transparent electrode, the third selective reflection layer being between the fifth transparent electrode and the organic emissive layer. The third selective reflection layer may selectively reflect the red color light emitted from the third sub-emission layer.

At least one of the first to third selective reflection layers may contain a cholesteric liquid crystal.

Each of the first to third selective reflection layers may contain a cholesteric liquid crystal, and, when an electric field is formed across the first to third selective reflection layers, respectively, each of the first to third selective reflection layers may transmit red, blue, and green color light.

The blue color light may be in a range of about 430 nm to about 480 nm, the green color light may be in a range of about 500 nm to about 570 nm, and the red color light may be in a range of about 600 nm to about 650 nm.

The first to third sub-emission layers may be spaced apart from the first selective reflection layer by a fourth length, the second sub-emission layer may be spaced apart from the second selective reflection layer by a fifth length that is greater than the fourth length, the third sub-emission layer may be spaced apart from the third selective reflection layer with a sixth length that is greater than the fifth length, and the fourth, fifth, and sixth lengths may be predetermined so as to generate microcavity effects for the respective sub-emission layers.

At least one of the first and second electrodes may be transparent.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
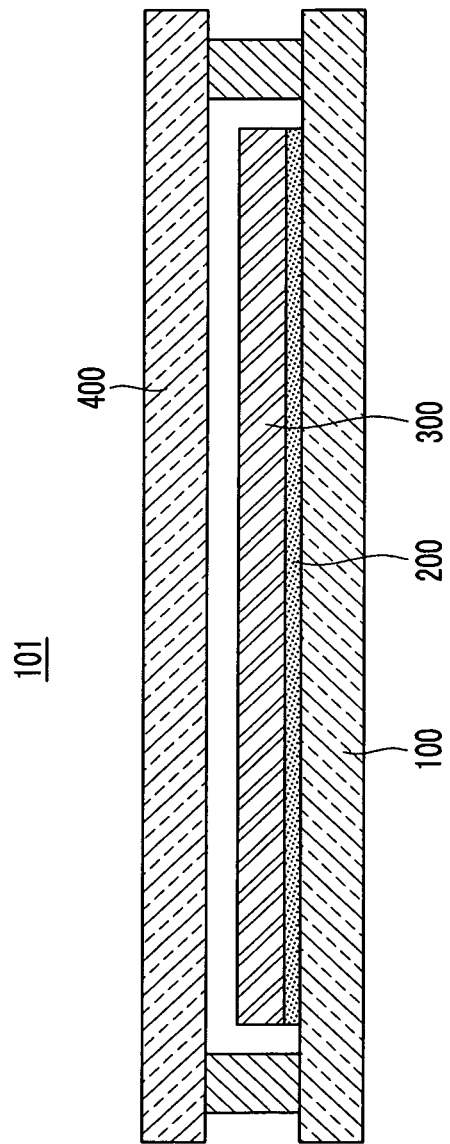
FIG. 1 illustrates a top plan view of an organic light emitting diode display according to a first example embodiment.

Korean Patent Application No. 10-2009-0110477, filed on Nov. 16, 2009, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An organic light emitting diode display 101 according to a first example embodiment will now be described with reference to FIGS. 1 to 9.

FIG. 1 illustrates a top plan view of the organic light emitting diode display 101 according to the first example embodiment As shown in FIG. 1, the display device 101 according to the first example embodiment may include a first substrate 100, wiring layer 200, an organic light emitting diode (OLED) 300, and a second substrate 400.

The first and second substrates 100 and 400 may be transparent. The first and second substrates 100 and 400 may be insulating. For example, the first and second substrates 100 and 400 may be substrates made of glass or a polymer. The first and second substrates 100 and 400 face each other, and may be sealed to each other by a sealant. The wiring layer 200 and the organic light emitting diode 300 may each be disposed between the first and second substrates 100 and 400. The first and second substrates 100 and 400 may protect the wiring layer 200 and the organic light emitting diode 300 from being affected by external factors.

The wiring layer 200 may include first and second thin film transistors 10 and 20 (shown in FIG. 2), and may transmit signals to the organic light emitting diode 300 so as to drive the organic light emitting diode 300. The organic light emitting diode 300 may emit light in accordance with the signals transmitted by the wiring layer 200.

The wiring layer 200 may further include one or more of a first selective reflection layer 810, a third transparent electrode 820, a second selective reflection layer 830, a fourth transparent electrode 840, a third selective reflection layer 850, and a fifth transparent electrode 860, which are described below.

The organic light emitting diode 300 may be formed on the wiring layer 200. The organic light emitting diode 300 may be formed in a region defined by a pixel defining layer on the wiring layer 200.

The organic light emitting diode 300 may be formed at the display area of the first substrate 100. The organic light emitting diode 300 may be formed through microelectromechanical systems (MEMS) technology such as photolithography. The organic light emitting diode 300 may receive signals from the wiring layer 200, and displays images in accordance with the received signals. The display may be constructed such that images are viewed from the side of the second substrate 400, i.e., the second substrate 400 may be the side facing the viewer as images are formed by the pixels.

The internal structure of the organic light emitting diode display device 101 according to the first example embodiment will now be described in greater detail with reference to FIGS. 2 to 6.

Figure 2:
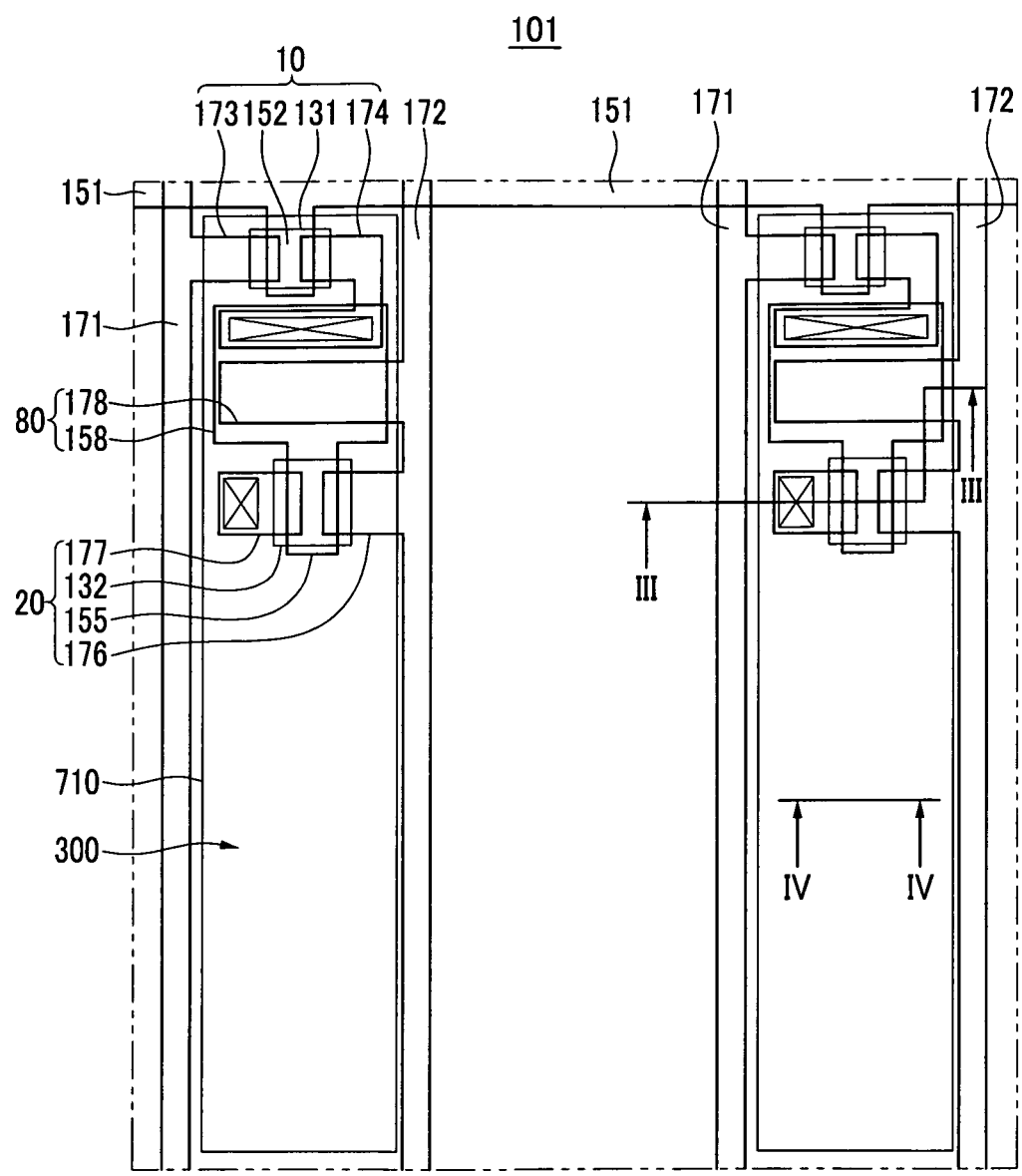
FIG. 2 illustrates a layout view of a pixel structure of a display device according to the first example embodiment.
Figure 3:
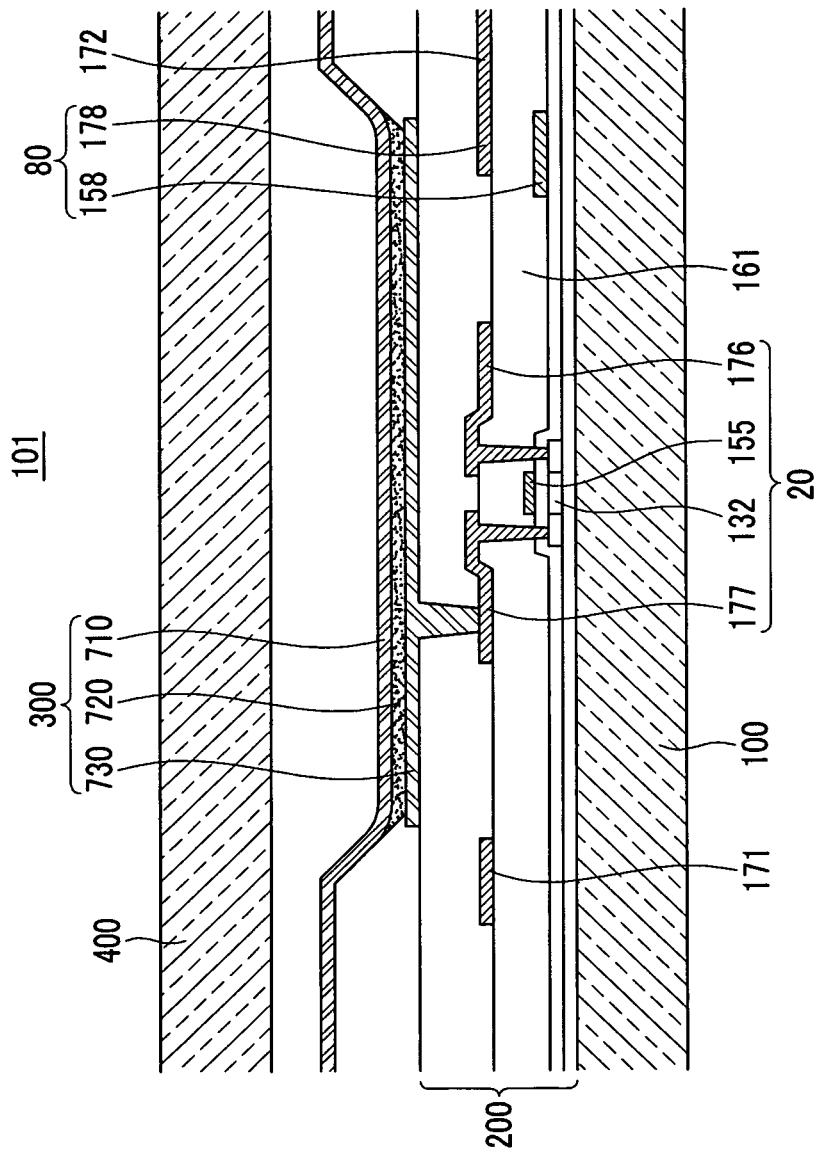
FIG. 3 illustrates a cross-sectional view of the display device taken along line of FIG. 2.
Figure 4:
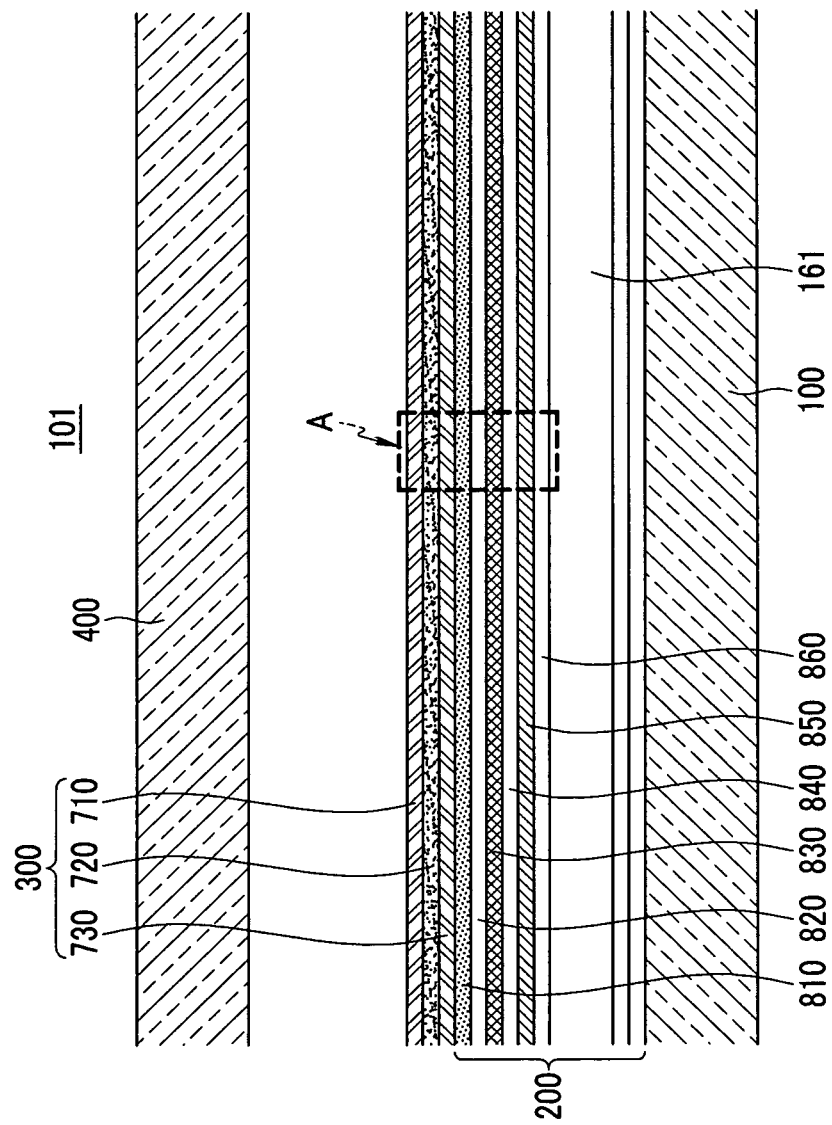
FIG. 4 illustrates a cross-sectional view of the display device taken along line IV-IV of FIG. 2.
Figure 5:
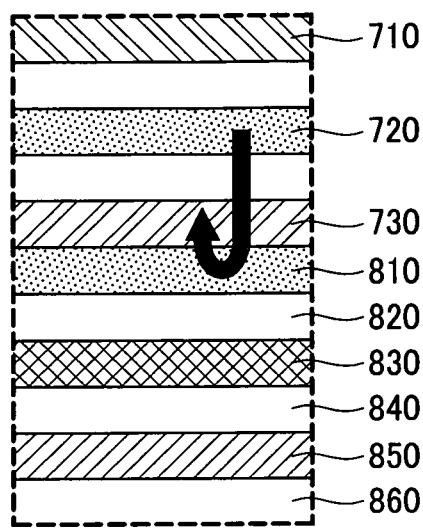
FIG. 5 illustrates an enlarged view of portion 'A' of FIG. 4.
Figure 6:
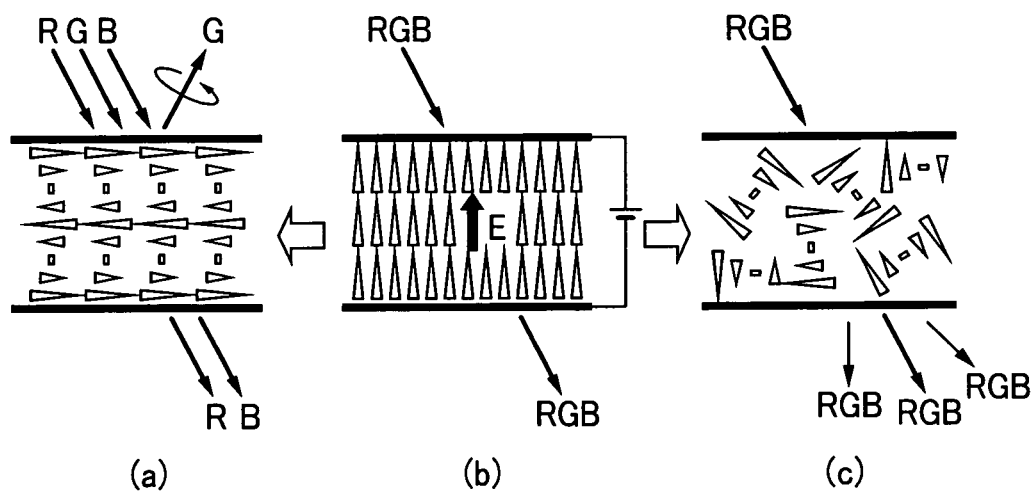
FIGS. 6(a), (b), and (c) illustrate properties of a cholesteric liquid crystal component of the display device according to the first example embodiment.

FIG. 2 illustrates a layout view of a pixel structure of a display device according to the first example embodiment. FIG. 3 illustrates a cross-sectional view of the display device taken along line III-III of FIG. 2. FIG. 4 illustrates a cross-sectional view of the display device taken along line IV-IV of FIG. 2. FIG. 5 illustrates an enlarged view of portion 'A' of FIG. 4.

A specific structure for the wiring layer 200 and the organic light emitting diode 300 is illustrated in FIG. 2 to FIG. 5. However, embodiments are not limited thereto. Rather, the wiring layer 200 and the organic light emitting diode 300 may have various structures. Further, the figures illustrate, as an example, an active matrix (AM) type of organic light emitting diode display with a 2Tr-1Cap structure where a pixel is provided with two thin film transistors (TFT) and one capacitor. However, embodiments are not limited thereto. The organic light emitting diode display is not limited in the number of thin film transistors, capacitors, or wires. A pixel may be a minimum image displaying unit, and the organic light emitting diode display may display images through a plurality of pixels.

As shown in FIG. 2 and FIG. 3, the organic light emitting diode display device 101 may include a switching thin film transistor 10 formed at each pixel, a driving thin film transistor 20, a capacitor 80, and the organic light emitting diode 300. The wiring layer 200 may include the switching thin film transistor 10, the driving thin film transistor 20, and the capacitor 80. The wiring layer 200 may further include a gate line 151 proceeding in a direction of the first substrate 100, and data and common power lines 171 and 172 crossing the gate line 151 and insulated from the gate line 151. A pixel may be defined by the gate lines 151, the data line 171, and the common power line 172 as boundaries. However, embodiments are not limited thereto.

The organic light emitting diode 300 may include a first electrode 710, an organic emissive layer 720 on the first electrode 710, and a second electrode 730 on the organic emissive layer 720. The first electrode 710 may serve as a cathode, i.e., an electron injecting electrode. The second electrode 730 may serve as an anode, i.e., a hole injecting electrode. However, embodiments are not limited thereto, and, depending upon the method of driving the display device 101, the first electrode 710 may function as an anode and the second electrode 730 may function as a cathode.

Holes and electrons from the first and second electrodes 710 and 730 may be injected into the organic emissive layer 720. The emission of light from the organic emissive layer 720 occurs when excitons, combinations of the injected holes and electrons, drop from an excited state to a ground state.

The first and second electrodes 710 and 730 may partially transmit light illuminated thereto, and partially reflect the light. At least one of the first and second electrodes 710 and 730 may be formed of a transparent conductive material such as indium tin oxide (ITO), indium zinc oxide (IZO), etc. It is preferable that the first and second electrodes 710 and 730 are each formed as transparent electrodes. The first and second electrodes 710 and 730 may have transparency from about 30% to about 99%.

The organic light emitting diode 300 may emit light in the direction of the first substrate 100 and in the direction of the second substrate 400. Thus, the organic light emitting diode 300 may function as a one panel dual emission type OLED.

The capacitor 80 includes a pair of capacitor plates 158 and 178 with an interlayer insulating layer 161 therebetween. The interlayer insulating layer 161 may function as the capacitor dielectric. The capacitive energy of the capacitor 80 depends on the charges charged at the capacitor 80 and the voltages of the capacitor plates 158 and 178.

The switching thin film transistor 10 may include a switching semiconductor layer 131, a switching gate electrode 152, a switching source electrode 173, and a switching drain electrode 174. The driving thin film transistor 20 may include a driving semiconductor layer 132, a driving gate electrode 155, a driving source electrode 176, and a driving drain electrode 177.

The switching thin film transistor 10 may be used as a switching element for selecting a pixel to be excited. The switching gate electrode 152 may be connected to the gate line 151. The switching source electrode 173 may be connected to the data line 171. The switching drain electrode 174 is spaced apart from the switching source electrode 173 by a distance, and may be connected to one of the capacitor plates, e.g., capacitor plate 158.

The driving thin film transistor 20 may apply driving power, for exciting the organic emissive layer 720 of the organic light emitting diode 300 within the selected pixel, to the second electrode 730. The driving gate electrode 155 may be connected to the capacitor plate 158 that is connected with the switching drain electrode 174. The driving source electrode 176 and the other capacitor plate 178 may each be connected to the common power line 172. The driving drain electrode 177 may be connected to the second electrode 730 of the organic light emitting diode 300 through a contact hole.

The switching thin film transistor 10 may be operated by way of the gate voltage applied to the gate line 151 so as to transmit the data voltage applied to the data line 171 to the driving thin film transistor 20. A voltage corresponding to the difference between the common voltage applied from the common power line 172 to the driving thin film transistor 20 and the data voltage transmitted from the switching thin film transistor 10 may be stored at the capacitor 80, and a current corresponding to the voltage stored at the capacitor 80 may flow to the organic light emitting diode 300 through the driving thin film transistor 20 so as to operate the organic light emitting diode 300.

The constituent elements of the switching thin film transistor 10 may be formed with transparent materials. The constituent elements of the driving thin film transistor 20 may be formed with transparent materials. Thus, the switching thin film transistor 10 and/or the driving thin film transistor 20 may be transparent.

As shown in FIG. 2 and FIG. 4, the first selective reflection layer 810, the third transparent electrode 820, the second selective reflection layer 830, the fourth transparent electrode 840, the third selective reflection layer 850, and the fifth transparent electrode 860 may be sequentially deposited in an area where the second electrode 730 and the organic emissive layer 720 are formed. In an implementation, at least one of the electrodes for the first selective reflection layer 810, the second selective reflection layer 830, and the third selective reflection layer 850 may be formed of a transparent conductive material such as indium tin oxide (ITO), indium zinc oxide (IZO), etc. The third, fourth and fifth transparent electrodes 820, 840 and 860 may have transparency from about 30% to about 99%.

In the organic light emitting diode display device 101 according to the first example embodiment, the first selective reflection layer 810, the third transparent electrode 820, the second selective reflection layer 830, the fourth transparent electrode 840, the third selective reflection layer 850, and the fifth transparent electrode 860 may be formed at an area where the second electrode 730 and the organic emissive layer 720 are widely formed (see cross-section IV-IV). However, embodiments are not limited thereto. The first selective reflection layer 810, the third transparent electrode 820, the second selective reflection layer 830, the fourth transparent electrode 840, the third selective reflection layer 850, and the fifth transparent electrode 860 may be overlapped with at least one of the switching thin film transistor 10 and the driving thin film transistor 20 (see FIG. 2 and cross-section III-III).

Furthermore, the organic light emitting diode display device 101 shown in FIG. 3 includes all of the first selective reflection layer 810, the third transparent electrode 820, the second selective reflection layer 830, the fourth transparent electrode 840, the third selective reflection layer 850, and the fifth transparent electrode 860. However embodiments are not limited thereto. Among the components of the first selective reflection layer 810, the third transparent electrode 820, the second selective reflection layer 830, the fourth transparent electrode 840, the third selective reflection layer 850, and the fifth transparent electrode 860, the organic light emitting diode display device 101 according to the first example embodiment may include only some thereof, e.g., the first selective reflection layer 810 and the third transparent electrode 820.

As shown in FIG. 4 and FIG. 5, the first selective reflection layer 810 may be formed on the second electrode 730. The first selective reflection layer 810 may contain a cholesteric liquid crystal (CLC). The selective reflection may be provided by the cholesteric liquid crystal.

Selective Reflection of Cholesteric Liquid Crystal:

FIGS. 6(a), (b), and (c) illustrate properties of a cholesteric liquid crystal component of the display according to the first example embodiment.

Referring to FIG. 6(a), the cholesteric liquid crystal has a layered structure such as with a smectic liquid crystal, but directors thereof are similar in molecular plane orientation to a nematic liquid crystal. Specifically, the cholesteric liquid crystal has a structure where the molecules thereof are helically oriented. That is, with the cholesteric liquid crystal, thin and long molecules proceed parallel to each other within a plane in the director axis direction, and the molecular axes are slightly deviated in orientation as it proceeds perpendicular to the plane. Accordingly, the cholesteric liquid crystal has an overall helical structure.

Referring to FIG. 6(a), the cholesteric liquid crystal is in a planar texture state when no electric field is applied to the cholesteric liquid crystal. The reference symbols R, G, and B of FIG. 6(a) refer to the red, green, and blue light, respectively. The planar texture cholesteric liquid crystal selectively reflects light of a predetermined wavelength, e.g., green light G, as shown in FIG. 6(a). The planar texture cholesteric liquid crystal selectively circular-polarizes and reflects the green light G, analogous to Bragg reflection.

Referring to FIG. 6(b), when an electric field of sufficient potential is applied to the cholesteric liquid crystal, the cholesteric liquid crystal is wholly oriented in the direction of the electric field. Thus, if the electric field is applied in the vertical direction, the cholesteric liquid crystal stands vertically so that all the light components illuminated onto the cholesteric liquid crystal are transmitted through the cholesteric liquid crystal.

Referring to FIG. 6(b), the cholesteric liquid crystal is in a homeotropic liquid crystal state when the electric field of sufficient potential is applied to the cholesteric liquid crystal. The homeotropic liquid crystal transmits all the light components illuminated thereon. The reference symbol RGB in FIG. 6(b) refers to the light of all the wavelength regions, and the homeotropic cholesteric liquid crystal shown in FIG. 6(b) transmits all the light illuminated onto the liquid crystal.

Referring to FIG. 6(c), when a predetermined period of time passes after the application of the electric field to the cholesteric liquid crystal, the cholesteric liquid crystal is wholly in a disordered state with no orientation. In this case, all the light components illuminated onto the cholesteric liquid crystal are transmitted while also being weakly scattered by the cholesteric liquid crystal.

Referring to FIG. 6(c), the cholesteric liquid crystal is in a focal conic state, which may be exhibited after the predetermined period of time passes following the application of the electric field to the cholesteric liquid crystal. The focal conic cholesteric liquid crystal transmits all the light components illuminated thereto and, at the same time, weakly scatters them. The reference symbol RGB in FIG. 6(c) refers to the light of all the wavelength regions, and the focal conic cholesteric liquid crystal shown in FIG. 6(c) transmits all the light components illuminated thereto and at the same time weakly scatters them.

As described above, the cholesteric liquid crystal transmits or selectively reflects the light illuminated thereto when an electric field is applied to the cholesteric liquid crystal or when no electric field is applied thereto.

Blue Light Selective Reflection:

Referring again to FIG. 4 and FIG. 5, the first selective reflection layer 810 corresponds to the organic emissive layer 720, and, among the color light emitted from the organic emissive layer 720, reflects the light of a first wavelength corresponding to the blue color light.

The first wavelength may be in a range of about 430 nm to about 480 nm within the wavelength range corresponding to the visible light region. The first selective reflection layer 810 may reflect only blue color light with a wavelength of about 430 nm to about 480 nm and, while reflecting the blue color light, may transmit light with a wavelength outside the range of about 430 nm to about 480 nm, e.g., light with a wavelength exceeding about 480 nm.

The first selective reflection layer 810, i.e., the cholesteric liquid crystal, may transmit light of all wavelength regions when an electrical signal is provided to the second electrode 730 and the third transparent electrode 820 neighboring thereto so as to form an electric field at the first selective reflection layer 810.

The third transparent electrode 820 may be formed on the first selective reflection layer 810. The third transparent electrode 820 may selectively form a vertical electric field at the first selective reflection layer 810 in association with the second electrode 730. When the third transparent electrode 820 forms a vertical electric field in association with the second electrode 730, the cholesteric liquid crystal contained in the first selective reflection layer 810 may be transitioned from the planar texture state to the homeotropic state (or from the planar texture state to the focal conic state) so as to transmit the light of all the wavelength regions illuminated onto the first selective reflection layer 810.

Green Light Selective Reflection:

The second selective reflection layer 830 may be formed on the third transparent electrode 820. The second selective reflection layer 830 corresponds to the organic emissive layer 720 and, among the light components emitted from the organic emissive layer 720, reflects light of a second wavelength, e.g., green color light.

The second wavelength may be in a range of about 500 nm to about 570 nm within the wavelength range corresponding to the visible light region. The second selective reflection layer 830 may reflect the green color light of the about 500 nm to about 570 nm wavelength. While reflecting the green color light, the second selective reflection layer 830 may transmit light with a wavelength outside the range of about 500 nm to about 570 nm, e.g., light with a wavelength exceeding about 570 nm.

The second selective reflection layer 830 may contain a cholesteric liquid crystal, which may be selected so as to reflect the green color light. The second selective reflection layer 830 may achieve the selective reflection as a result of the properties of the cholesteric liquid crystal. Furthermore, the second selective reflection layer 830 may transmit light of all the wavelength regions when an electrical signal is provided to the third transparent electrode 820 and the fourth transparent electrode 840 neighboring thereto so as to form an electric field at the second selective reflection layer 830.

The fourth transparent electrode 840 may be formed on the second selective reflection layer 830. The fourth transparent electrode 840 may selectively form a vertical electric field at the second selective reflection layer 830 in association with the third transparent electrode 820. When the fourth transparent electrode 840 forms a vertical electric field in association with the third transparent electrode 820, the second selective reflection layer 830 may transmit light of all the wavelength regions therethrough.

Red Light Selective Reflection:

The third selective reflection layer 850 may be formed on the fourth transparent electrode 840. The third selective reflection layer 850 corresponds to the organic emissive layer 720, and, among the light components emitted from the organic emissive layer 720, reflects the light of a third wavelength corresponding to the red color light.

The third wavelength may be in a range of about 600 nm to about 650 nm within the wavelength range corresponding to the visible light region. The third selective reflection layer 850 may reflect only the red color light of about 600 nm to about 650 nm wavelength, while transmitting light with a wavelength outside the range of about 600 nm to about 650 nm, e.g., light with a wavelength exceeding about 650 nm.

The third selective reflection layer 850 contains a cholesteric liquid crystal, and exhibits selective reflection due to the cholesteric liquid crystal. The third selective reflection layer 850 may transmit the light of all the wavelength regions by way of the properties of the cholesteric liquid crystal when signals flow to the fourth transparent electrode 840 and the fifth transparent electrode 860 neighboring thereto so as to form an electric field at the third selective reflection layer 850.

The fifth transparent electrode 860 may be formed on the third selective reflection layer 850. The fifth transparent electrode 860 may selectively form a vertical electric field at the third selective reflection layer 850 in association with the fourth transparent electrode 840. When the fifth transparent electrode 860 forms a vertical electric field in association with the fourth transparent electrode 840, the third selective reflection layer 850 may transmit the light of all the wavelength regions therethrough.

In the blue, green, and red light selective reflecting layers described above, the third transparent electrode 820, the fourth transparent electrode 840, and the fifth transparent electrode 860 may partially transmit the light illuminated thereto, and partially reflect it. The third transparent electrode 820, the fourth transparent electrode 840 and the fifth transparent electrode 860 may each be formed using a transparent conductive material such as indium tin oxide, indium zinc oxide, etc.

As described above, the first selective reflection layer 810, the second selective reflection layer 830, and the third selective reflection layer 850 may each selectively reflect light of differing wavelength ranges. Respective CLC materials may be used for the respective selective reflection layers. In an implementation, one or more of the selective reflection layers may be bistable, such that at least partial transparency may be maintained in the absence of the applied full-transparency electric field.

Figure 7:
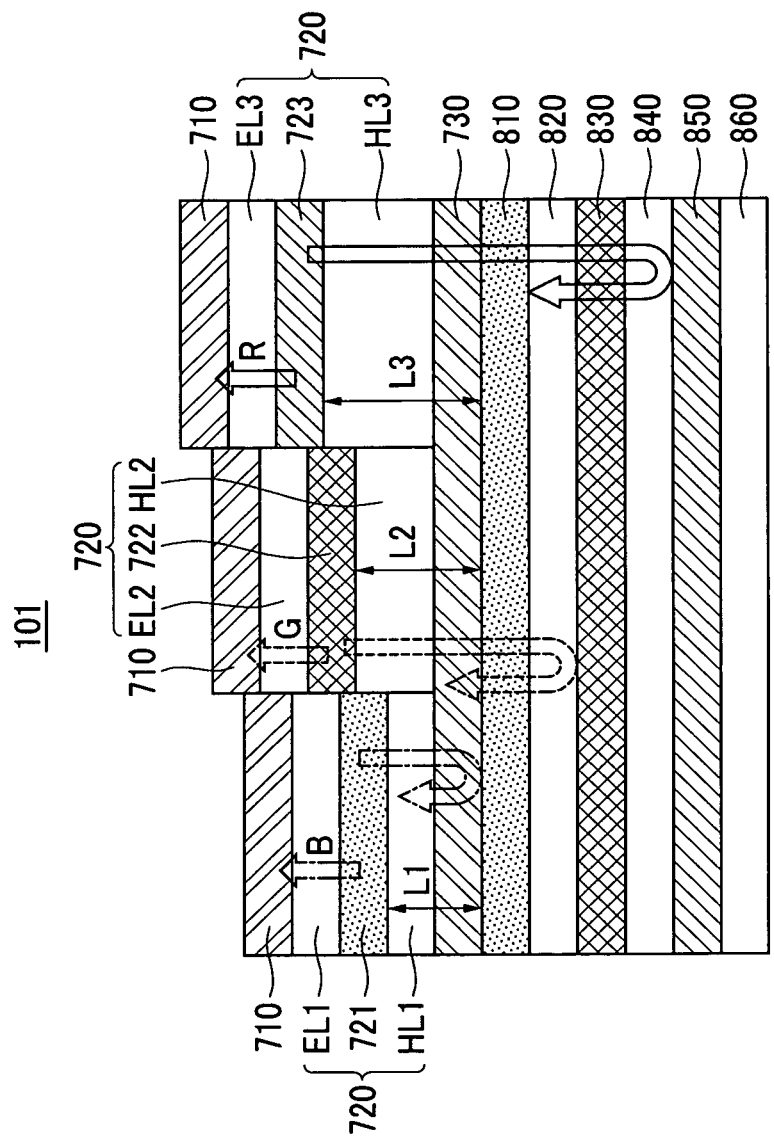
FIG. 7 to FIG. 9 illustrate cross-sectional views of main components of an organic light emitting diode display according to the first example embodiment, illustrating the functions of selective reflection layers.
Figure 8:
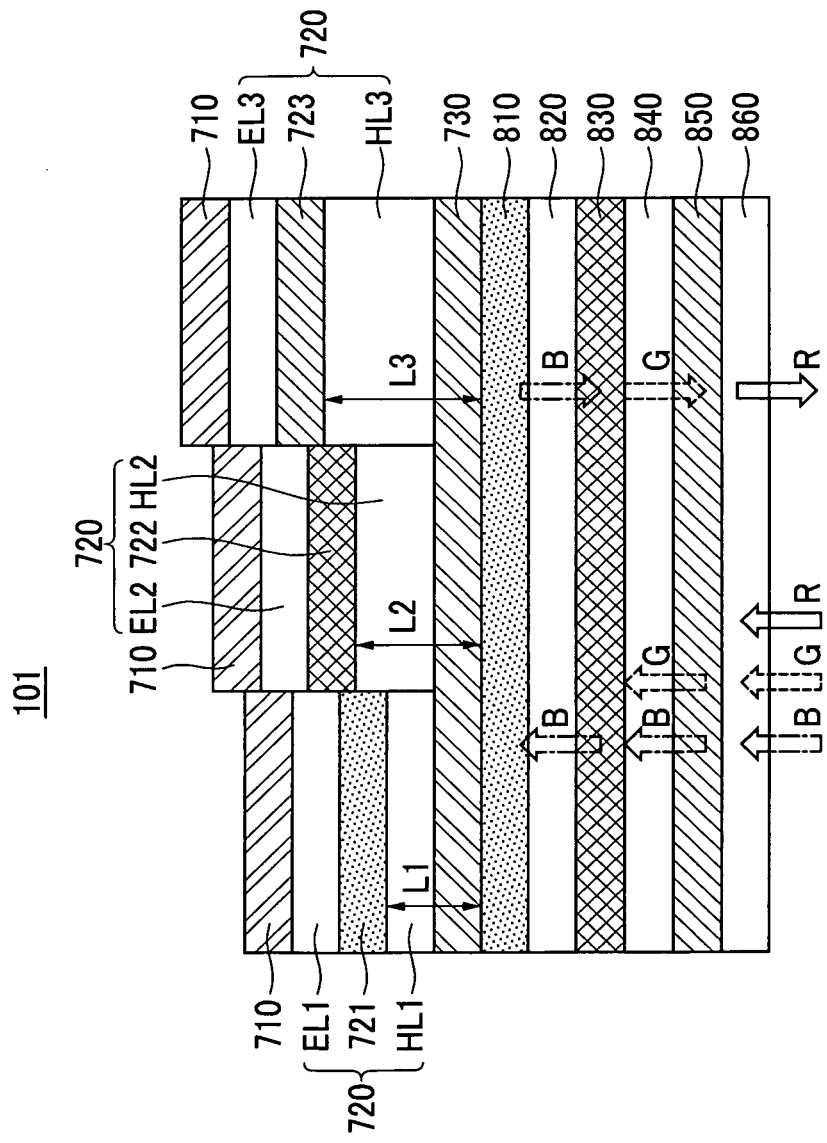
Figure 9:
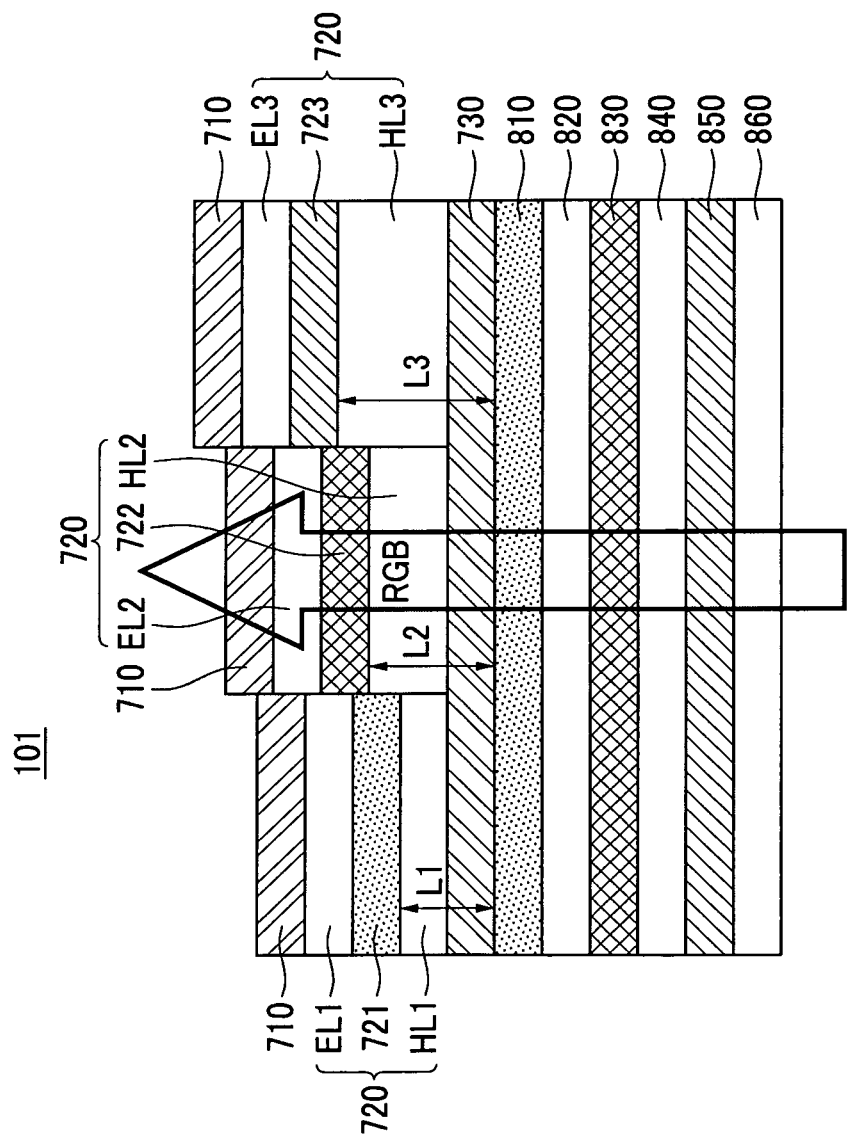

FIG. 7 to FIG. 9 illustrate cross-sectional views of main components of an organic light emitting diode display according to the first example embodiment, illustrating the functions of selective reflection layers. The reference symbols R, G, and B of FIG. 7 to FIG. 9 refer to the red, green, and blue color light.

As shown in FIG. 7 to FIG. 9, the organic emissive layer 720 may include a first sub-emission layer 721 emitting the blue color light, a second sub-emission layer 722 emitting the green color light, and a third sub-emission layer 723 emitting the red color light.

The organic emissive layer 720 may include a first electron organic layer EL1, a second electron organic layer EL2, and a third electron organic layer EL3 disposed between the first electrode 710 and the first to third sub-emission layers 721, 722, and 723. The first electron organic layer EL1, the second electron organic layer EL2, and the third electron organic layer EL3 may include at least one electron injection layer (EIL) and at least one electron transport layer (ETL), respectively.

The organic emissive layer 720 may include a first hole organic layer HL1, a second hole organic layer HL2, and a third hole organic layer HL3 disposed between the second electrode 730 and the first to third sub-emission layers 721, 722, and 723. The first to third hole organic layers HL1, HL2, and HL3 may include at least one hole injection layer (HIL) and at least one hole transport layer (HTL).

Microcavity Effect:

The first sub-emission layer 721 may be spaced apart from the first selective reflection layer 810 by a first length L1. The second sub-emission layer 722 may be spaced apart from the first selective reflection layer 810 by a second length L2 that is larger than the first length L1. The third sub-emission layer 723 may be spaced apart from the first selective reflection layer 810 by a third length L3 that is larger than the second length L2. Thus, the first sub-emission layer 721, the second sub-emission layer 722, and the third sub-emission layer 723 may have different spacings relative to the second electrode 730 so that the blue, green, and red color light emitted from the first sub-emission layer 721, the second sub-emission layer 722, and the third sub-emission layer 723 are continuously reflected to the first electrode 710 by way of the second electrode 730 while being transmitted through the initial reflection space regions that are spaced apart from each other by different lengths up to the second electrode 730. Thus, the blue, green, and red color light emitted from the first to third sub-emission layers 721, 722, and 723 may each be continuously reflected by different lengths so that a microcavity effect is produced and the efficiency of light emission from the organic emissive layer 720 is increased.

As shown in FIG. 7, the first selective reflection layer 810, the second selective reflection layer 830, and the third selective reflection layer 850 may stand on different planes. Accordingly, the blue color light emitted from the first sub-emission layer 721 may be continuously reflected through the length from the first selective reflection layer 810 to the first electrode 710, and the green color light emitted from the second sub-emission layer 722 may be continuously reflected through the length from the second selective reflection layer 830 to the first electrode 710. The red color light emitted from the third sub-emission layer 723 may be continuously reflected through the length from the third selective reflection layer 850 to the first electrode 710. Thus, another microcavity effect may be generated so that the efficiency of light emission from the organic emissive layer 720 is further increased.

As shown in FIG. 8, when no electric field is applied to the first selective reflection layer 810, the second selective reflection layer 830, and the third selective reflection layer 850, with the visible light illuminated onto the organic light emitting diode display device 101 from the outside, the blue, green, and red color light components of the external light may be reflected from the first to third selective reflection layers 810, 830, and 850 back towards the first substrate 100. Thus, the external light illuminated onto the organic light emitting diode display device 101 and the light emitted from the organic emissive layer 720 may be kept separate. In this way, the external light and the light emitted from the organic emissive layer 720 may not be overlapped with each other, such that the color reproduction range of the organic light emitting diode display device 101 may be increased and the image quality of the whole organic light emitting diode display device 101 may be improved.

As shown in FIG. 9, when an electric field is applied to the first selective reflection layer 810, the second selective reflection layer 830, and the third selective reflection layer 850, the first to third selective reflection layers 810, 830, and 850 may transmit the light of all the wavelength regions therethrough so that an object at the backside (i.e., the side of the first substrate 100) of the organic light emitting diode display device 101 is recognizable through the organic light emitting diode display device 101. Thus, when an electric field is applied to the first selective reflection layer 810, the second selective reflection layer 830, and the third selective reflection layer 850, the organic light emitting diode display 101 may appear to be entirely transparent.

An electric field may be selectively applied to the first to third selective reflection layers 810, 830, and 850. The electric field may be selectively applied to at least one of the first to third selective reflection layers 810, 830, and 850 depending upon the images to be displayed by the organic light emitting diode display 101 and the desired degree of recognition of an object placed at the backside of the organic light emitting diode display device 101.

As described above, the organic light emitting diode display device 101 according to the first example embodiment may include at least one of the first selective reflection layer 810, the second selective reflection layer 830, and the third selective reflection layer 850, which reflect light in accordance with the wavelength of the light emitted from the organic emissive layer 720. Accordingly, the transparency, the light emission efficiency, and the image quality of the organic light emitting diode display device 101 may be improved.

An organic light emitting diode display 102 according to a second example embodiment will now be described with reference to FIG. 10. The reference symbols R, G, and B of FIG. 10 refer to the red, green, and blue color light.

Figure 10:
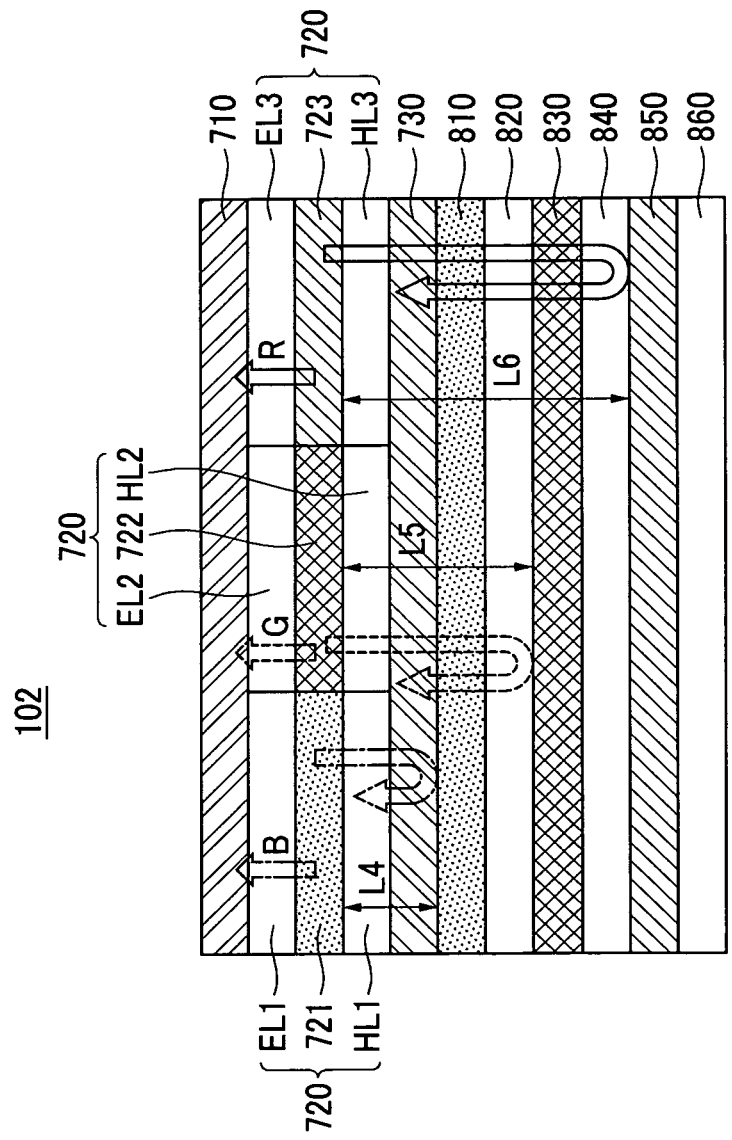
FIG. 10 illustrates a cross-sectional view of main components of an organic light emitting diode display according to a second example embodiment.

FIG. 10 illustrates a cross-sectional view of main components of an organic light emitting diode display according to a second example embodiment.

As shown in FIG. 10, first to third sub-emission layers 721, 722, and 723 may be spaced apart from a first selective reflection layer 810 by a fourth length L4. The second sub-emission layer 722 may be spaced apart from the second selective reflection layer 830 by a fifth length L5 that is greater than the fourth length L4. The third sub-emission layer 723 may be spaced apart from the third selective reflection layer 850 by a sixth length L6 that is greater than the fifth length L5.

Thus, as the first to third selective reflection layers 810, 830, and 850 may stand on different planes, the blue color light emitted from the first sub-emission layer 721 may be continuously reflected through the space with the fourth length L4 from the first selective reflection layer 810 to the first electrode 710, the green color light emitted from the second sub-emission layer 722 may be continuously reflected through the space with the fifth length L5 from the second selective reflection layer 830 to the first electrode 710, and the red color light emitted from the third sub-emission layer 723 may be continuously reflected through the space with the sixth length L6 from the third selective reflection layer 850 to the first electrode 710. In this way, the microcavity effect may be provided so that the efficiency of light emission from the organic emissive layer 720 is increased.

As described above, with the organic light emitting diode display 102 according to the second example embodiment, the first to third sub-emission layers 721, 722, and 723 may be formed on a same plane while being spaced apart from the first to third selective reflection layers 810, 830, and 850 by different lengths, respectively. Further, the first to third selective reflection layers 810, 830, and 850 may selectively reflect the light emitted from the organic emissive layer 720 depending upon the wavelength thereof. Consequently, the transparency, the light emission efficiency, and the image quality of the organic light emitting diode display 102 may be improved.

A transparent organic light emitting diode display according to example embodiments may provide increased light emission efficiency and, at the same time, improve image quality, because light emitted from the organic light emitting diode may not be overlapped with light transmitted from the outside.

Example embodiments have been disclosed herein, and although specific terms are employed, they are used and are to be interpreted in a generic and descriptive sense only and not for purpose of limitation. For example, the display may serve as a light source, and the OLEDs may emit light of respective colors, e.g., red, green, and blue, which may be combined to form a white light for illumination, or the OLEDs may all emit light of a same color. Accordingly, it will be understood by those of ordinary skill in the art that various changes in form and details may be made without departing from the spirit and scope of the present invention as set forth in the following claims.

What is claimed is:

1. An organic light emitting diode display, comprising:
    an organic emissive layer disposed between the first electrode and the second electrode;
    a first selective reflection layer disposed to receive light from the organic emissive layer; and
    a third transparent electrode, the first selective reflection layer being between the third transparent electrode and the organic emissive layer, wherein:
    the organic emissive layer includes:
        a first sub-emission layer configured to emit a blue color light;
        a second sub-emission layer configured to emit a green color light; and
        a third sub-emission layer configured to emit a red color light, and
    the first selective reflection layer selectively reflects the blue color light emitted from the first sub-emission layer.

2. The organic light emitting diode display as claimed in claim 1, wherein:
    the first sub-emission layer is spaced apart from the first selective reflection layer by a first length,
    the second sub-emission layer is spaced apart from the first selective reflection layer by a second length that is greater than the first length,
    the third sub-emission layer is spaced apart from the first selective emission layer by a third length that is greater than the second length, and
    the first, second and third lengths are predetermined so as to generate microcavity effects.

3. The organic light emitting diode display as claimed in claim 1, further comprising:
    a second selective reflection layer, the third transparent electrode being between the second selective reflection layer and the organic emissive layer; and
    a fourth transparent electrode, the second selective reflection layer being between the fourth transparent electrode and the organic emissive layer, wherein:
    the second selective reflection layer selectively reflects the green color light emitted from the second sub-emission layer.

4. The organic light emitting diode display as claimed in claim 3, further comprising:
    a third selective reflection layer, the fourth transparent electrode being between the third selective reflection layer and the organic emissive layer; and
    a fifth transparent electrode, the third selective reflection layer being between the fifth transparent electrode and the organic emissive layer, wherein:
    the third selective reflection layer selectively reflects the red color light emitted from the third sub-emission layer.

5. The organic light emitting diode display as claimed in claim 4, wherein at least one of the first to third selective reflection layers contains a cholesteric liquid crystal.

6. The organic light emitting diode display as claimed in claim 5, wherein:
    each of the first to third selective reflection layers contains a cholesteric liquid crystal, and
    when an electric field is formed across the first to third selective reflection layers, respectively, each of the first to third selective reflection layers transmits red, blue, and green color light.

7. The organic light emitting diode display as claimed in claim 4, wherein:
    the blue color light is in a range of about 430 nm to about 480 nm,
    the green color light is in a range of about 500 nm to about 570 nm, and
    the red color light is in a range of about 600 nm to about 650 nm.

8. The organic light emitting diode display as claimed in claim 4, wherein:
    the first to third sub-emission layers are spaced apart from the first selective reflection layer by a fourth length,
    the second sub-emission layer is spaced apart from the second selective reflection layer by a fifth length that is greater than the fourth length,
    the third sub-emission layer is spaced apart from the third selective reflection layer with a sixth length that is greater than the fifth length, and the fourth, fifth, and sixth lengths are predetermined so as to generate microcavity effects for the respective sub-emission layers.

9. The organic light emitting diode display as claimed in claim 1, wherein at least one of the first and second electrodes is transparent.

* * * * *